Aug. 4, 1970 M. R. WACHS 3,523,257
COUPLED PAIR TUNNEL DIODE VOLTAGE CONTROLLED OSCILLATOR
Filed Aug. 28, 1968
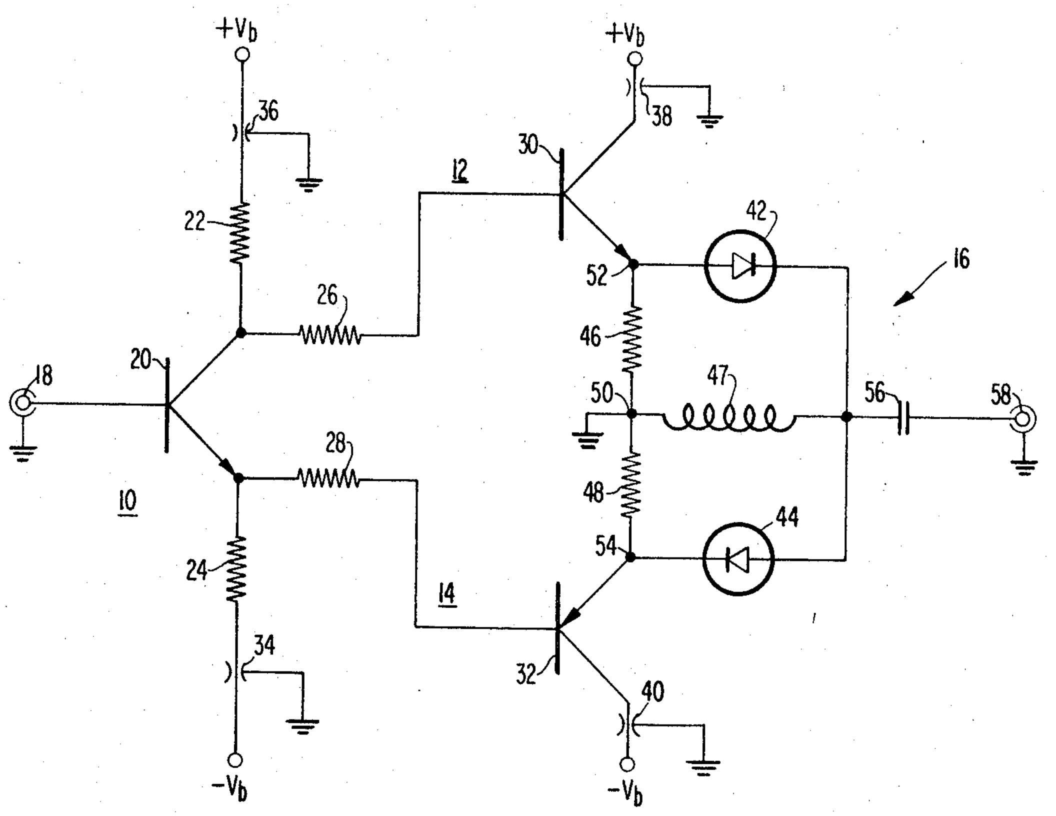
INVENTOR
MARVIN R. WACHS
BY
Sughrue, Rothwell, Mion, Zinn & Macpeak
ATTORNEYS 3,523,257

COUPLED PAIR TUNNEL DIODE VOLTAGE CONTROLLED OSCILLATOR

Marvin R. Wachs, Bowie, Md., assignor to Communications Satellite Corporation

Filed Aug. 28, 1968, Ser. No. 755,945
Int. Cl. H03b 7/08; H03c 3/02
U.S. Cl. 331—107 3 Claims

ABSTRACT OF THE DISCLOSURE

A coupled pair tunnel diode astable oscillator is provided with a varying balanced bias voltage to vary the output frequency. An input voltage is applied to a phase splitter and the opposite phase outputs are connected to the tunnel diode pair oscillator through a pair of complementary type emitter follower connected transistors.

BACKGROUND OF THE INVENTION

The invention is in the field of tunnel diode voltage controlled oscillators.

Coupled pair tunnel diode circuits can operate as astable, monostable or bistable oscillators with an inductance connected in the circuit. The coupled pair, like a single tunnel diode, has a current voltage characteristic which includes two positive resistance regions and a negative resistance region, but is an improvement over the single tunnel diode oscillator because of the ability to vary the slope of the negative resistance region in the coupled pair tunnel diode oscillator. The coupled pair circuit is a balanced voltage circuit and requires a balanced bias voltage.

SUMMARY OF THE PRESENT INVENTION

The coupled pair tunnel diode circuit is provided with a balanced "bias" voltage which varies in dependence upon an unbalanced input voltage. The input voltage is applied through a split level phase inverter and the opposite phase outputs therefrom are applied through emitter followers to the balanced input terminals of the coupled pair tunnel diode oscillator. The invention has application as a high frequency oscillator possessing a linear relationship between input voltage and output frequency. Also, the invention provides a minimum time delay between a change in the input voltage and a responsive change in the output frequency.

BRIEF DESCRIPTION OF THE DRAWINGS

The only drawing is a schematic diagram of a preferred embodiment of the present invention.

DETAILED DECRIPTION OF THE DRAWINGS

The circuit of the drawing includes a phase inverter 10, a pair of current drivers 12, 14, and a coupled pair tunnel diode astable multivibrator 16, connected between an input terminal 18 and an output terminal 58. The phase inverter 10 comprises an NPN transistor 20 having its collector and emitter terminals connected through a pair of equal valued resistors 22 and 24 to opposite polarity voltages $+V_b$ and $-V_b$, respectively. The connections between resistors 22, 24 and the voltage $+V_b$, $-V_b$ are by-passed to ground by a pair of high value capacitors 36, 34.

The current drivers comprise a pair of emitter follower connected transistors 30 and 32 which have their base terminals connected respectively to the collector and emitter terminals of transistor 10 via connecting resistors 26 and 28. Transistor 30 is an NPN transistor and has its collector connected to the positive voltage $+V_b$. Transistor 32 is a PNP transistor and has its collector connected to the negative voltage $-V_b$. The connection between the voltages $+V_b$, $-V_b$ and the collectors of transistors 30, 32 are by-passed to ground by high value by-pass capacitors 38, 40, respectively.

The coupled pair tunnel diode oscillator comprises a pair of series connected, substantially identical tunnel diodes 42, 44, a pair of series connected equal valued resistors 46, 48 and an inductance 47. The terminal 50 is connected to ground and the output is connected to an output terminal 58 via coupling capacitor 56.

As is well known in the prior art, the coupled pair tunnel diode circuit 16 with the inductance 46 connected as shown and with a bias voltage connected between terminals 52, 54 operates as either an astable, monostable or a bistable multivibrator depending upon the value of resistors 46, 48 and the current voltage characteristics of the tunnel diodes. With the value of the resistors chosen so that the load line created intersects the tunnel diode pair current-voltage characteristic curve at only a single point which is on the negative slope of the characteristic curve, the circuit operates as an astable multivibrator, or free running oscillator. The frequency of the ouput depends upon the circuit elements and also on the bias voltage connected between the terminals 52, 54.

The varying input control voltage at input terminal 18 is split into a pair of equal amplitude, opposite phase voltages which appear at the collector and emitter terminals respectively of transistor 20. The voltage at the collector of transistor 20 is of positive polarity and has a 180° phase relation to the in-put voltage. The voltage at the emitter of transistor 20 is of negative polarity and is in phase with the input voltage. The positive polarity voltage is connected to terminal 52 via the current driver 12 and the negative polarity voltage is connected to terminal 54 via current driver 14. In this manner a varying balanced voltage is applied to terminals 52, 54 of the coupled pair tunnel diode oscillator 16 to vary the output frequency thereof.

The following is an example of specific component values for the circuit shown in the drawing:

Resistors:
- 22, 24—60 ohms
- 26, 28—470 ohms
- 46, 48—20 ohms

Capacitors:
- 56—0.001 microfarad
- 34, 36, 38, 40—470 picofarads

Supply voltages:
- $\pm V_b$—±2 volts

Transistors:
- 20, 30—2N3959
- 32—2N4260 (two in parallel)

Tunnel diodes:
- 42, 44—GaAs tunnel diode (10 ma. peak current)

While the invention has been particularly shown and described with reference to a preferred embodiment thereof, it will be understood by those skilled in the art that various changes in form and details may be made therein without departing from the spirit and scope of the invention.

What is claimed is:

1. A tunnel diode voltage controlled oscillator comprising, (a) a balanced tunnel-diode-pair oscillator comprising a pair of substantially identical tunnel diodes connected in series between first and second terminals, a pair of resistors connected in series between said first and second terminals, an inductor connected between the junction of said series connected resistors and the junction of said series connected tunnel diodes, and a ground terminal connected to one of said junctions, and (b) means for connecting a balanced variable output voltage between said first and second terminals comprising, an input terminal for receiving an unbalanced input voltage, a phase inverter means connected to said input terminal and responsive to said input voltage for producing a pair of equal amplitude opposite phase output voltages, a pair of current drivers having their input terminals connected to said output voltages respectively and their output terminals connected to said first and second terminals respectively.

2. A tunnel diode voltage controlled oscillator as claimed in claim 1 wherein said phase inverter means comprises a first transistor having base, emitter and collector terminals, said base terminal being connected to said input terminal, a pair of equal valued resistances connected respectively to said emitter and collector terminals, and equal amplitude opposite polarity voltages connected respectively to said pair of resistances.

3. A tunnel diode voltage controlled oscillator as claimed in claim 2 wherein said pair of current drivers comprises second and third transistors each having base, emitter and collector terminals, means connecting said emitter and collector terminals of said first transistor to the bases of said second and third transistors, respectively, the emitters of said second and third transistors being connected to said first and second terminals, respectively, and equal amplitude opposite polarity bias voltages connected to the collectors of said second and third transistors, respectively, said second and third transistors being of the opposite type conductivity.

References Cited

UNITED STATES PATENTS 3,421,029 1/1969 Ortel -------------- 307—322

OTHER REFERENCES

Lesk et al., "The Tunnel Diode—Circuits and Applications," Electronics, Nov. 27, 1959, pp. 60–64, 307–322.

ROY LAKE, Primary Examiner

S. H. GRIMM, Assistant Examiner

U.S. Cl. X.R.

331—177; 307—322; 332—29